United States Patent [19]
Sunkavalli

[11] Patent Number: 6,052,310
[45] Date of Patent: Apr. 18, 2000

[54] METHOD FOR TIGHTENING ERASE THRESHOLD VOLTAGE DISTRIBUTION IN FLASH ELECTRICALLY ERASABLE PROGRAMMABLE READ-ONLY MEMORY (EEPROM)

[75] Inventor: Ravi S. Sunkavalli, Santa Clara, Calif.

[73] Assignee: Advanced Micro Devices, Sunnyvale, Calif.

[21] Appl. No.: 09/132,981

[22] Filed: Aug. 12, 1998

[51] Int. Cl.[7] .................................................. G11C 16/04
[52] U.S. Cl. .............................. 365/185.29; 365/185.21; 365/185.3
[58] Field of Search ........................ 365/185.29, 185.3, 365/185.33, 185.21, 226

[56] References Cited

U.S. PATENT DOCUMENTS

| | | | |
|---|---|---|---|
| 5,508,959 | 4/1996 | Lee et al. | 365/185.3 |
| 5,546,340 | 8/1996 | Hu et al. | 365/183.3 |
| 5,642,311 | 6/1997 | Cleveland et al. | 365/185.3 |
| 5,844,847 | 12/1998 | Kobatake | 365/185.29 |
| 5,901,090 | 5/1999 | Haddad et al. | 365/185.29 |

*Primary Examiner*—David Nelms
*Assistant Examiner*—Tuan T. Nguyen
*Attorney, Agent, or Firm*—David G. Alexander; Arter & Hadden LLP

[57] ABSTRACT

A flash Electrically-Erasable Programmable Read-Only Memory includes a plurality of field effect transistor memory cells each having a source, drain, floating gate and control gate. The state of erasure of the cells is determined by sensing the source voltage of the cells. An erase pulse is applied to the cells by a power supply which applies a source pull-up voltage to the cells configured in accordance with a predetermined function of the state of erasure. The power supply includes a variable current source and/or a resistor which are continuously adjusted as the erase operation progresses to provide an optimal vertical field across the tunnel oxide layers of the cells. Alternatively, the power supply can include a voltage regulator which is continuously adjusted to directly apply an optimal source voltage to the cells. The state of erasure can also be predetermined as a function of time or applied erase pulses, and the power supply adjusted in an open loop manner. The state of erasure of the memory is preferably monitored by applying alternating erase and monitoring pulses to the cells. The source voltage is sensed during the monitoring pulses to provide an accurate indication of the erase state. The source current drive during the monitoring pulses is sufficiently reduced from the current drive during the erase pulses that the source voltage will not clamp to the main source supply voltage, thereby providing a correlation between the source voltage and erase state.

30 Claims, 13 Drawing Sheets

METHOD FOR TIGHTENING ERASE THRESHOLD VOLTAGE DISTRIBUTION IN FLASH ELECTRICALLY ERASABLE PROGRAMMABLE READ-ONLY MEMORY (EEPROM)

BACKGROUND OF THE INVENTION

1. Field of the Invention

The present invention generally relates to the art of microelectronic integrated circuits, and more specifically to a method for tightening the erase threshold voltage distribution in a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

More specifically, during program and read operations only one wordline which is connected to the control gates of a row of cells is held high at a time, while the other wordlines are grounded. However, a positive voltage is applied to the drains of all of the cells. If the threshold voltage of an unselected cell is zero or negative, leakage current will flow through the source, channel and drain of the cell.

This undesirable effect is illustrated in FIG. 1. The drains of a column of floating gate cell transistors $T_0$ to $T_m$ are connected to a bitline BL, which is itself connected to a bitline driver 1. The sources of the transistors $T_0$ to $T_m$ are typically connected to ground. One of the transistors $T_0$ to $T_m$ is selected for a program or read operation by applying a positive voltage, e.g. 5 V, to its control gate which turns on the transistor. The control gates of the unselected transistors are connected to ground.

As viewed in FIG. 1, 5 V is applied to the transistor $T_1$ which turns it on. A current $I_1$ flows through the transistor $T_1$ from ground through its source, channel (not shown) and drain and through the bitline BL to the driver 1. Ideally, the bitline current $I_{BL}$ should be equal to $I_1$.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline can exceed the cell read current. This makes it impossible to read the state of a cell on the bitline and renders the memory inoperative.

FIG. 2 illustrates how the threshold voltages of the cells or bits in a flash EEPROM can differ substantially from each other following an erase operation as shown by a solid line curve which represents the numbers of cells having particular values of threshold voltage $V_T$. It will be seen that the least erased cells will have a relatively high threshold voltage $V_T$MAX, whereas the most overerased cells will have a low threshold voltage which is below a minimum acceptable value $V_T$MIN that can be negative. The characteristic illustrated in FIG. 2 is known as the threshold voltage distribution.

FIG. 3 illustrates how the background leakage current of a cell varies as a function of threshold voltage. The lower (more negative) the threshold voltage, the higher the leakage current. It is therefore desirable to prevent cells from being overerased and reduce the threshold voltage distribution to as low a range as possible, with ideally all cells having the same high threshold voltage after erase on the order of 2 V.

It is known in the art to reduce the threshold voltage distribution by performing an overerase correction operation which reprograms the most overerased cells to a higher threshold voltage. This operation will result in the threshold voltage curve being altered to the shape indicated by broken line in FIG. 2 in which the threshold voltages of all of the cells are above the minimum acceptable value $V_T$MIN. An overerase correction operation of this type is generally known as Automatic Programming Disturb (APD).

An APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS", issued Jun. 24, 1997 to Lee Cleveland. The method includes sensing for overerased cells and applying programming pulses thereto which bring their threshold voltages back up to acceptable values.

A significant factor which results in an increase in the threshold voltage distribution is the source pull-up voltage which is applied to the sources of the cells during the erase pulses. As electrons are removed from the floating gates of the cells by Fowler-Nordheim tunneling through the tunnel oxide, the vertical electric field across the tunnel oxide decreases. The electric field at the beginning of erase must not be too high or it will adversely affect the tunnel oxide reliability and result in increased threshold voltage distribution.

The End-of-Erase (EOE) electric field at the completion of the erase operation must not be too low, or it will be insufficient to erase slow cells. However, it must not be too high, or it will cause overerasure of fast and typical cells in the main distribution.

It is known in the art to apply a main source drive voltage $V_{SS}$ to the sources of the cells through a pure resistive load. However, this expedient is limited in that the vertical electric field drops relatively sharply. If sufficient source voltage is applied to produce a suitable EOE field, the initial electric field will be too high. Conversely, if the source voltage is reduced to produce a suitably low initial electric field, the EOE field will be too low.

Another prior art expedient is to provide a source pull-up power supply including a constant current source. The object of this arrangement is to attempt to provide a constant electric field by maintaining the band-to-band tunneling current constant. However, the result is significant overerasure of fast and typical cells due to an excessively high EOE field.

FIG. 4 illustrates a composite source pull-up power supply 1 which includes a current source 2 and a load resistor R and represents an improvement over the pull-up supplies described above which include only a resistor or a constant current source. The current source 2 is connected to a main source supply voltage $V_{SS}$.

A load line for the power supply 1 is illustrated in FIG. 5, which plots source current $I_S$ as a function of source voltage $V_S$. If the current source 2 were omitted, the load line would include a downwardly slanting solid line portion 3 and a broken line portion 3'. The solid line portion 3 intersects the horizontal $V_S$ axis at the value $V_{SS}$ (open circuit) at which the current $I_S$ is zero. The broken line portion 3' intersects the vertical $I_S$ axis at a value $V_{SS}/R$ (short circuit), at which the current is maximum and the voltage $V_S$ is zero.

The current source 2 limits supplies a constant current of value $I_S$MAX and limits the maximum voltage to $V_S$MAX. The effect of the current source 2 is illustrated by a solid line curve portion 4 and a broken line curve portion 4'. Thus, for the power supply 1, the source voltage $V_S$ will increase along the curve portion 4 with the constant current $I_S$MAX being supplied to the cell 1 until the curve portions 3 and 4 intersect at a voltage $V_S1$, and then increase with decreasing source current $I_S$ along the curve portion 3 to the limit value $V_{SS}$.

The improvement provided by the current source 1 results from the current source 2 limiting or reducing the initial vertical electric field, and the resistor R helping to control the EOE field. However, not even the improved power supply 1 is able to provide an optimal vertical electric field throughout the entire erase operation, resulting in an undesirably large threshold voltage spread.

The problem is exacerbated by a phenomenon known as "cycling", in which the source voltage tends to increase as more erase pulses are applied to the cells. FIG. 6 illustrates the effect of cycling in which a curve 5 represents the threshold voltage increase without cycling. A curve 6 represents the threshold voltage characteristic at the end of erase due to the effect of cycling. It will be noted that the curve 6 is shifted upwardly from the curve 5, and that the source voltage $V_S$ becomes clamped to the limit value $V_{SS}$ along the curve 6 long before the cells have become completely erased.

The cycling phenomenon is caused by the generation of hot electron-hole pairs resulting from band-to-band tunneling. Whereas Fowler-Nordheim tunneling from the floating gate through the tunnel oxide layer to the source results in erasure of a cell, band-to-band tunneling also occurs between the substrate and the source. When a positive voltage is applied to the source junction with the control gate negative, a deep depletion region is formed underneath the gate-to-source overlap region. Electron-hole pairs are generated by the tunneling of valence band electrons into the conduction band. The electrons are collected by the source junction, and the holes are collected by the substrate.

Since the minority carriers (holes) generated thermally or by band-to-band tunneling in the source region flow to the substrate due to the lateral field near the Si—SiO$_2$ interface, the deep depletion region remains present and the band-to-band tunneling can continue without creating an inversion layer. The generated holes gain energy because of the electric field in the depletion region. While the majority of these generated holes flow into the substrate, some of them gain sufficient energy to surmount the Si—SiO$_2$ barrier and are trapped in the tunnel oxide layer.

The trapped holes reduce the horizontal electric field which results in reduced band-to-band tunneling current. This effect increases as the cells are cycled (progressively more erase pulses are applied thereto). Cycling results in exacerbation of the resistor and constant current source pull-up loads problems as described above. As the power supply 1 is a combination of a resistor and current source load, the individual problems associated therewith remain. There remains a substantial need in the art for a source pull-up power supply which provides a reduction in these undesirable effects and which can reduce the threshold voltage distribution of the erased memory.

It is also desirable to monitor the erase state of the memory in order to determine how far the erase operation has progressed and how many more erase pulses need to be applied. This information can be advantageously used to adjust the configuration of the pull-up power supply as erase progresses so that the applied electric field will be as close to optimal as possible.

As illustrated in FIG. 6, the main contribution to the source current $V_S$ is band-to-band tunneling (the Fowler-Nordheim tunneling current which causes the actual cell erasure is orders of magnitude lower), and this generally provides an accurate indication of the erase state. It is therefore at least theoretically possible to monitor the erase state of the memory by sensing the source current during the erase pulses (concurrent erase and verify).

However, in many applications the source voltage clamps to the maximum value $V_{SS}$ as indicated by the curve 6 and thereby provides no useful information relating to the erase state. For this reason, it is impractical in these applications to monitor the erase state by sensing the source voltage during the erase pulses. A further need exists in the art for an accurate method of determining the state of erasure of a flash EEPROM.

SUMMARY OF THE INVENTION

It is an object of the present invention to provide a method for erasing a flash Electrically-Erasable Programmable Read-Only Memory (EEPROM) which overcomes the above described limitations of the prior art.

More specifically, a flash Electrically-Erasable Programmable Read-Only Memory includes a plurality of field effect transistor memory cells each having a source, drain, floating gate and control gate. The state of erasure of the cells is determined by sensing the source voltage of the cells. An erase pulse is applied to the cells by a power supply which applies a source pull-up voltage to the cells configured in accordance with a predetermined function of the state of erasure.

The power supply includes a variable current source and/or a resistor which are continuously adjusted as the erase operation progresses to provide an optimal vertical field across the tunnel oxide layers of the cells. Alternatively, the power supply can include a voltage regulator which is continuously adjusted to directly apply an optimal source voltage to the cells. It is also possible to predetermine the state of erasure as a function of time or applied erase pulses, and adjust the power supply in an open loop manner as the erase operation progresses.

In a preferred embodiment of the invention, the state of erasure of the memory is monitored by applying alternating erase and monitoring pulses to the cells. The source voltage is sensed during the monitoring pulses to provide an accurate indication of the erase state. The source current drive during the monitoring pulses is sufficiently reduced from the current drive during the erase pulses that the source voltage will not clamp to the main source supply voltage, thereby providing a correlation between the source voltage and erase state.

The present invention thereby overcomes the limitations of the prior art and fulfills the need for a method of accurately sensing the state of a flash EEPROM, and optimally adjusting the electric field across the tunnel oxide layers of the memory cells and thereby reducing the threshold voltage distribution.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 7:
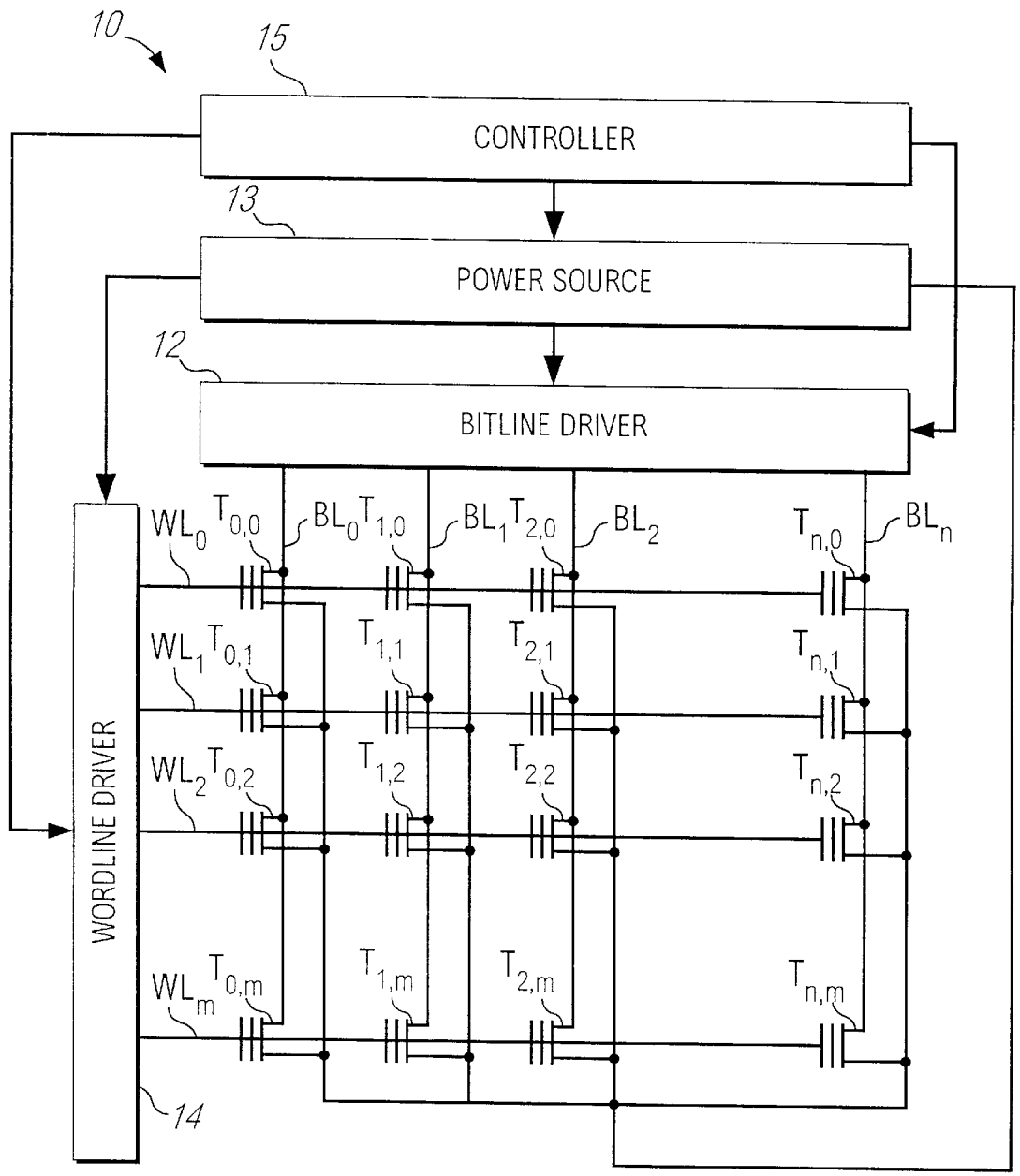
FIG. 7 is a simplified electrical schematic diagram of a flash EEPROM.

FIG. 7 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source or supply 13 under the control of a controller 15 which is typically on-chip logic circuitry. The controller 15 also controls the drivers 12 and 14 to address the memory cells individually or collectively as will be described below.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 7 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power supply 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high. Reading is preferably performed using sense amplifiers and a reference current array, the details of which are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

Figure 8:
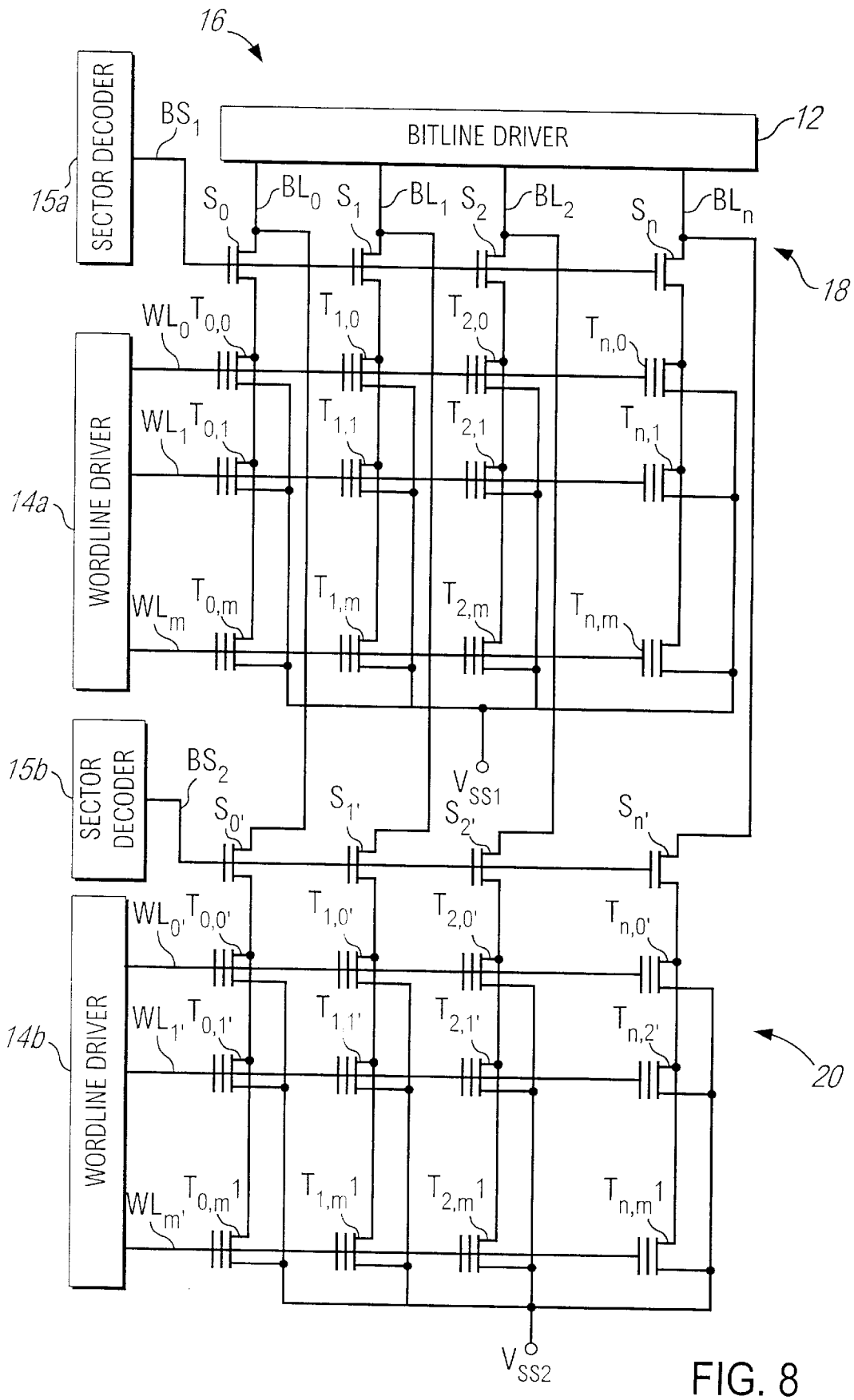
FIG. 8 is similar to FIG. 7 but illustrates a flash EEPROM having cells arranged in pages or banks.

It is common to organize the individual memory cells of a flash EEPROM into a plurality of banks or sectors. FIG. 8 illustrates a flash EEPROM memory 16 according to the present invention which is similar to the memory 10 except that the cells are divided into a plurality, in the illustrated example two, of banks (also known as pages or sectors), each of which can be programmed, erased and read independently.

A typical EEPROM will comprise, for example, 8 sectors, each of which includes 512K memory cells. For simplicity of illustration and description, the memory 16 is shown as including only a first cell bank 18 and a second cell bank 20. However, it will be understood that the present invention is applicable to a memory having any number of sectors or banks. The memory 16 also includes a controller and a power source or supply similar to the memory 10, although not explicitly illustrated.

The memory cells in the first bank 18 are designated in the same manner as in FIG. 7, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $S_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{SS}1$, whereas the sources of the cells in the bank 20 are connected to a common source supply voltage $V_{SS}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0$ to $S_n$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 9:
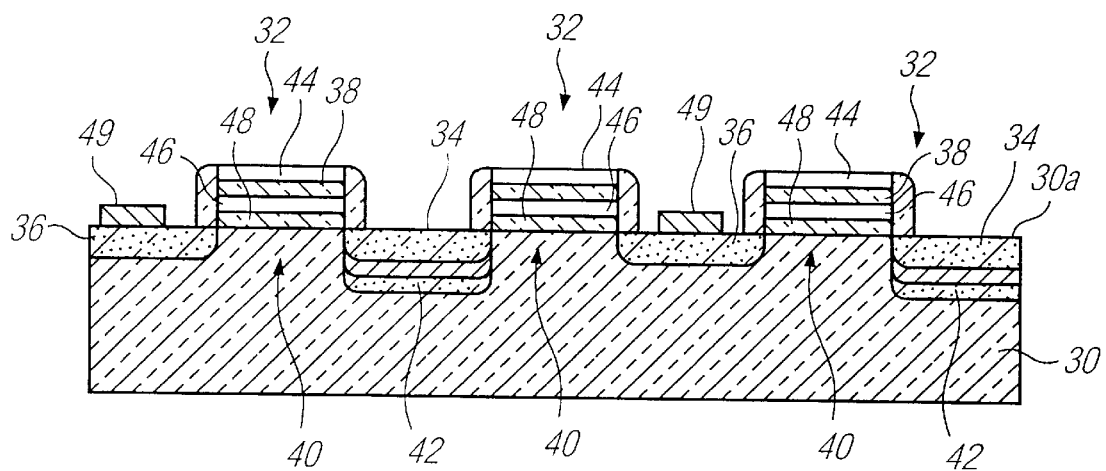
FIG. 9 is a simplified partial sectional view of a flash EEPROM illustrating the elements of the cells thereof.

FIG. 9 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

Figure 1:
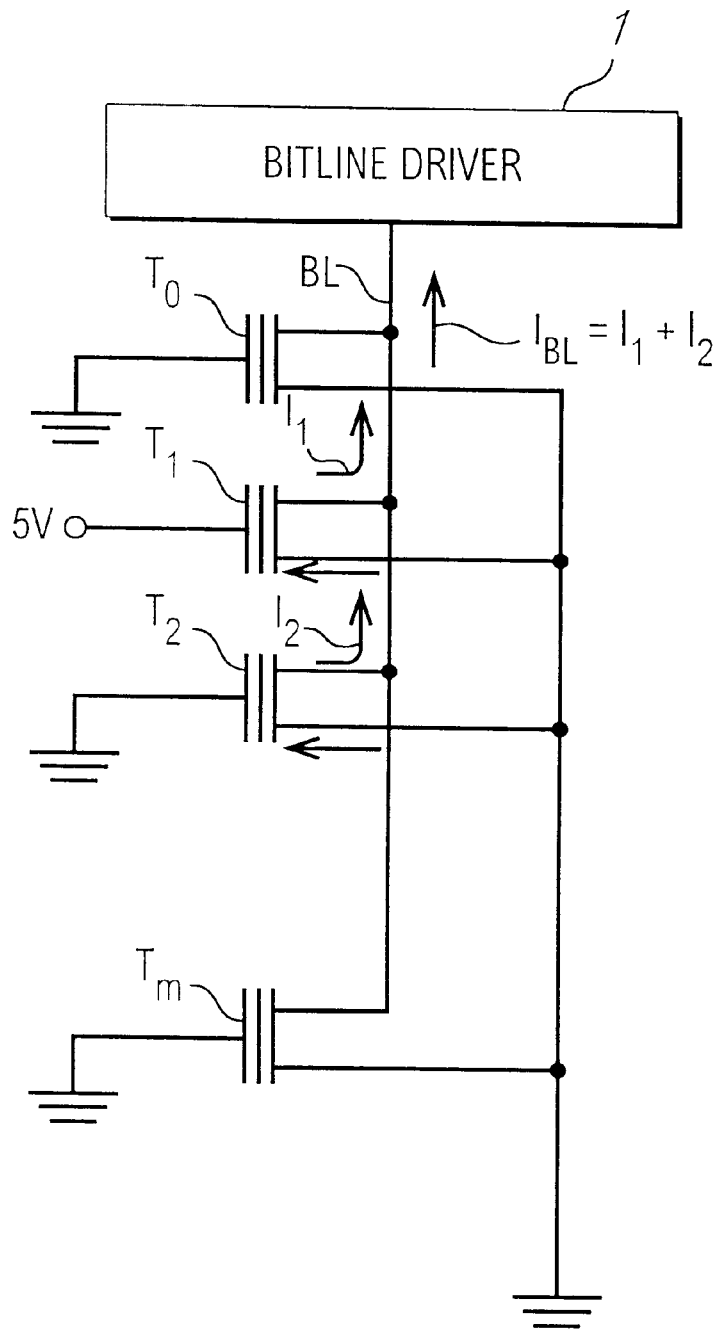
FIG. 1 is a simplified electrical schematic diagram showing how background leakage current is generated in a prior art flash Electrically Erasable Programmable Read-Only Memory (EEPROM)
Figure 2:
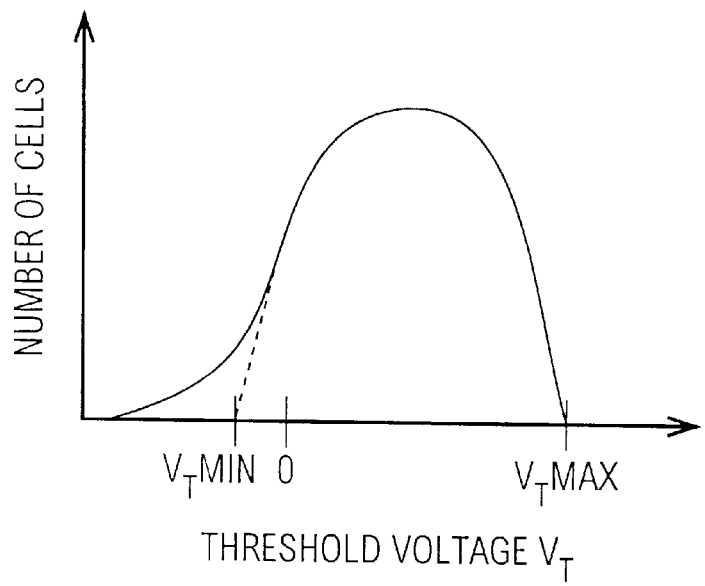
FIG. 2 is a graph illustrating a threshold voltage distribution in a flash EEPROM after an erase operation.
Figure 3:
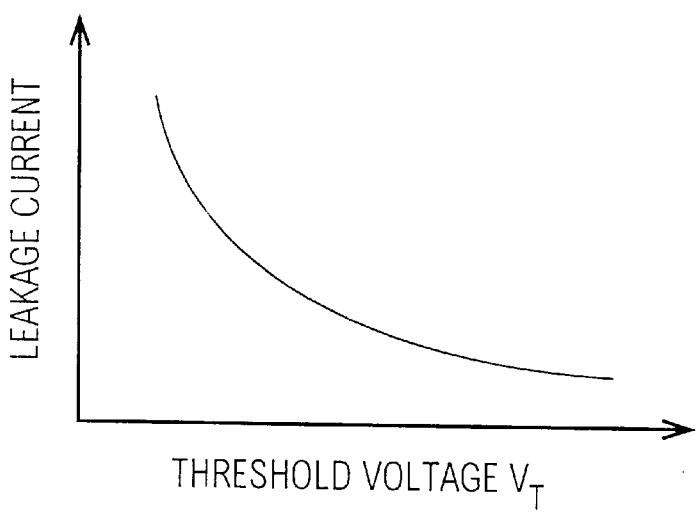
FIG. 3 is a graph illustrating how background leakage current varies as a function of threshold voltage for the least erased cells.
Figure 4:
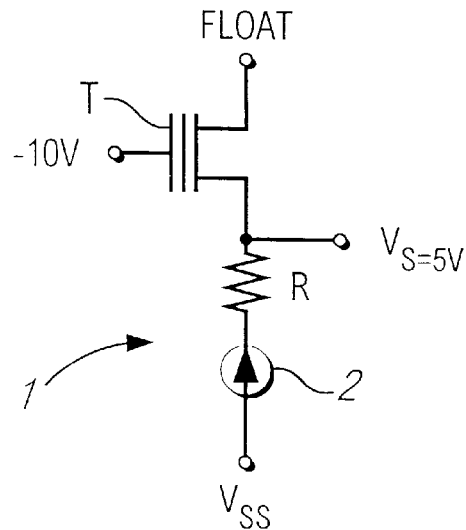
FIG. 4 is a fragmentary electrical schematic diagram illustrating a resistive power supply applying a source voltage to a memory cell.
Figure 5:
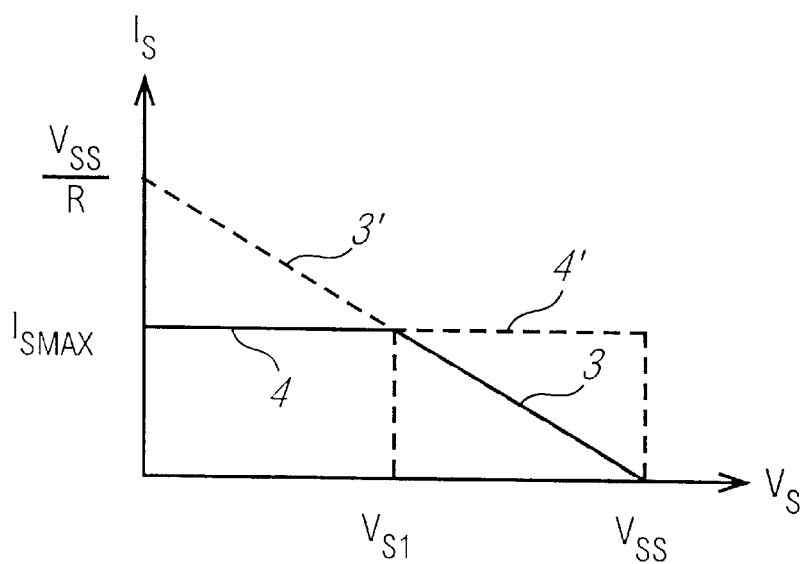
FIG. 5 is a graph illustrating a load line of the power supply of FIG. 4.
Figure 6:
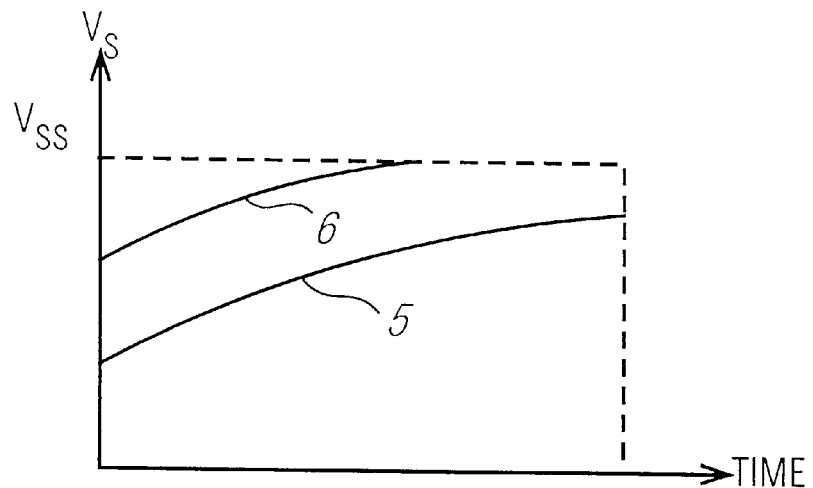
FIG. 6 is a graph illustrating how the source voltage clamps to a maximum value due to cycling as an erase procedure progresses.
Figure 10:
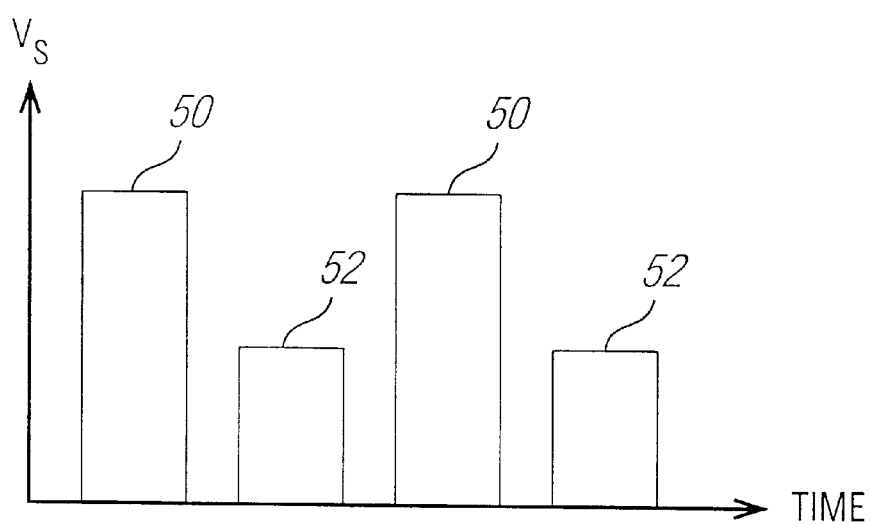
FIG. 10 is a timing diagram illustrating the present erase method.

FIG. 10 illustrates how the present invention overcomes the cycling problem described above with reference to FIG. 6 and enables the erase state of the memory 10 or 16 to be accurately determined by sensing the pull-up source voltage applied to the cells.

As shown in the drawing, erase pulses 50 are applied to the cells. After each erase pulse 50, a sensing or monitoring pulse 52 is applied to the cells. Preferably, the same gate voltage, e.g. −10 V, is applied to the gates of the cells during both the erase and monitoring pulses, although it is within the scope of the invention to make these voltages different. However, a lower value of drive current is applied to the sources of the cells during the monitoring pulses than during the erase pulses.

The lower current results in a lower source voltage which is prevented from clamping to the main source voltage $V_{SS}$. As viewed in FIG. 10, the source voltage applied during the erase pulses is typically on the order of 5 V, whereas the average source voltage applied during the monitoring pulses is on the order of 2 V to 3 V.

Figure 11:
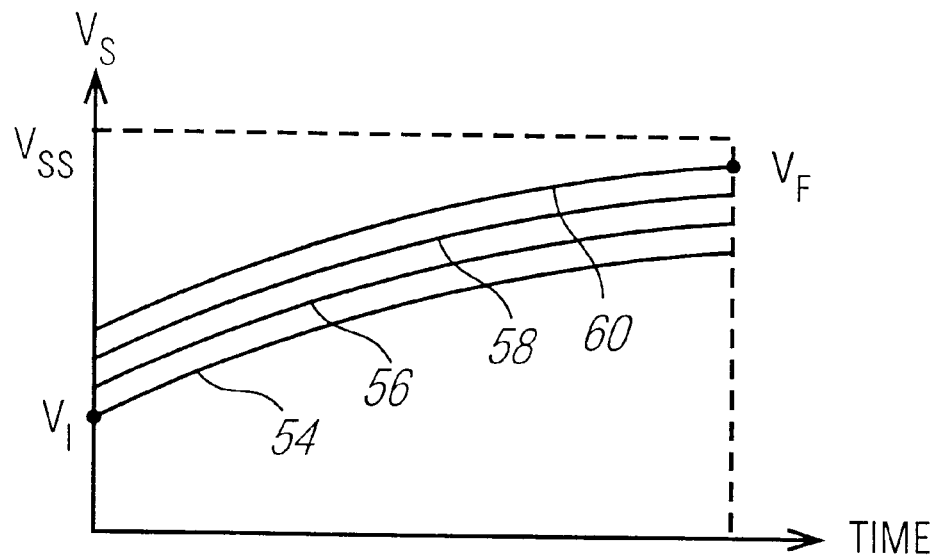
FIG. 11 is a graph illustrating how the source voltage increases due to cycling in accordance with the present invention.

FIG. 11 illustrates the effects of cycling as described above, but with the source drive current low enough that the source voltage will not reach and be clamped to $V_{SS}$. A curve 54 illustrates the initial variation of source voltage with time (or equivalently the number of applied erase pulses) which would hold if cycling were not present. The source voltage has an initial value $V_I$ where the curve 54 intersects the $V_S$ axis.

Curves 56, 58 and 60 illustrate how the variation of source voltage with time is progressively shifted due to the effects of cycling, with the curve 60 representing the relationship at the finish of the erase operation after numerous cycles. The final value of source voltage is $V_F$, as indicated at the end of the curve 60.

If the source voltage is maintained at a very low value, the effect of cycling will be reduced and the final curve will not differ greatly from the initial curve. In such a case, the state of erasure of the memory will substantially correspond to the curve 54.

However, in some applications it will not be practical to maintain the source voltage applied during the monitoring pulses at such a low value, and the source voltage curve will be shifted due to cycling as illustrated in FIG. 11. The result is that the source voltage $V_S$ will vary with time as illustrated by a curve 62 in FIG. 12, starting at the initial value $V_I$ and ending at the final value $V_F$. The entire source voltage vs. erase time curve shifts upwardly with cycling. Since the sources of the cells are connected together while the erase and monitoring pulses are applied, the sensed source voltage represents an average value for all of the cells, or the source voltage for a typical cell.

The actual shape of the curve 62 will be different for each application, and can be determined empirically or using a computer simulation. Once the curve is determined, the source voltage can be sensed or monitored after applying an erase pulse as described above. Each point on the curve 62 equates a value of sensed source voltage to a corresponding state of erasure as represented by time, number of applied erase pulses, or percentage of completion of the erase operation.

In this manner, the present invention enables accurate calculation of the state of erasure of the memory cells as a predetermined function (represented by the curve 62) of sensed source voltage. The calculation can be performed using logic circuitry, a look-up table, or any other suitable methodology. Once the erase state of the memory is determined, the erase parameters can be suitably adjusted to optimize the vertical electric field across the tunnel oxide and thereby tighten the threshold voltage distribution.

Figure 13A:
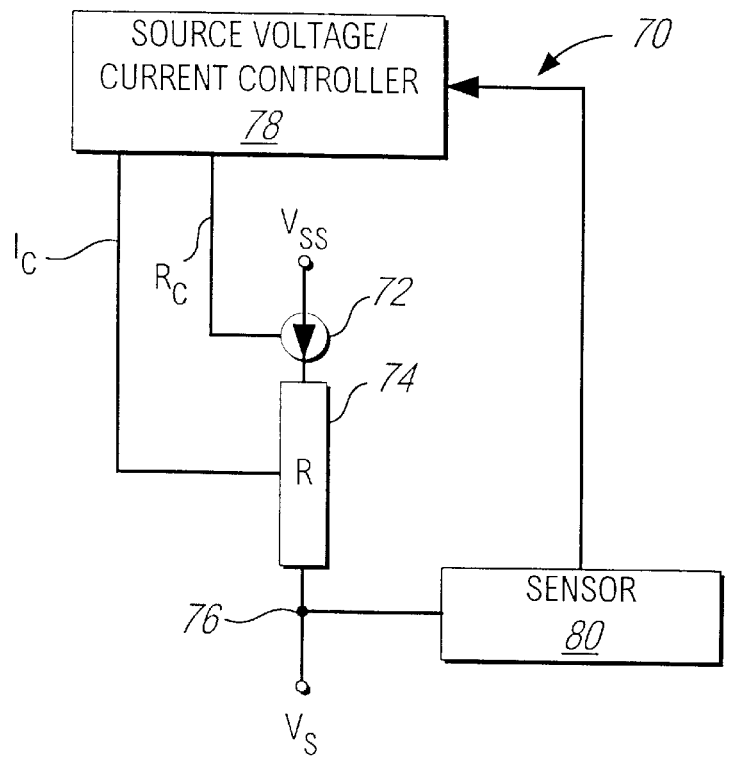
FIGS. 13a and 13b are electrical schematic diagrams illustrating a power supply having a continuously variable current source and resistance.
Figure 13B:
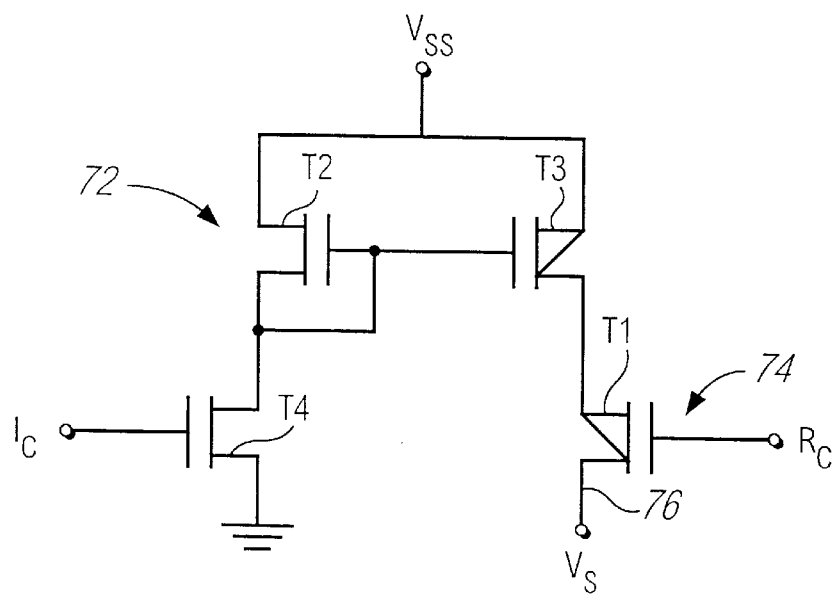

FIGS. 13a and 13b illustrate a circuit arrangement for practicing the present invention. As viewed in FIG. 13a, a resistive source pull-up power supply 70 includes a current source 72 which is connected to a main source voltage supply $V_{SS}$ of the memory. The current source 72 is connected through a resistance 74 to a circuit point 76 which is in turn connected to the sources of the memory cells. The current source 72 and/or the resistance 74 are variably controlled by a source voltage/current controller 78. A sensor 80 is connected to the point 76 for sensing the source voltage and applying an electrical voltage or other parameter representing the sensed source voltage to the controller 78 or other control element.

Only the erase current source or the sensor is connected to the array source at any given time. In other words, the sensor 80 is active only during the monitoring pulse.

The controller 78 generates a current control voltage $I_C$ and a resistance control voltage $R_C$ which are applied to the current source 72 and resistance 74 respectively. An example of the source 72 and resistance 74 is illustrated in FIG. 13b. The resistance 74 is constituted by a PMOS transistor T1, whereas the current source 72 includes PMOS transistors T2 and T3 and an NMOS transistor T4.

The transistors T2, T3 and T4 are connected to function as a current mirror. The drains of the transistors T2 and T3 are connected to the voltage $V_{SS}$, and the gates of the transistors T2 and T3 are connected together. The source of the transistor T3 is connected to the drain of the transistor T1, whereas the source of the transistor T1 is connected to the point 76 and thereby to the sources of the memory cells. The resistance control signal $R_C$ is applied to the gate of the transistor T1.

The transistor T2 is connected in a diode configuration, with its source connected to its gate. The source of the transistor T2 is connected to the drain of the transistor T4. The source of the transistor T4 is connected to ground, whereas the gate of the transistor T4 is connected to receive the current control signal $I_C$.

The current through the transistor T4, and therefore through the transistor T2, is determined by the value of $I_C$. Since the drain to gate voltages of the transistors T2 and T3 are the same, the current through the transistor T2 is mirrored to the transistor T3. Thus, the current flow through the transistors T2 and T3 are the same and are determined by the current control voltage $I_C$.

The transistor T1 functions as a voltage controlled resistor, with the resistance determined by the resistance control voltage $R_C$. Thus, the current of the current source 72 and the resistance of the resistance 74 can be continuously controlled to any desired value by applying the corresponding control voltages $I_C$ and $R_C$ thereto.

As described above, the source voltage $V_S$ must be prevented from clamping to $V_{SS}$ while the monitoring pulse is applied to the cells and the source voltage $V_S$ is sensed by the sensor 80. This can be accomplished in several ways. The current source 72 can be configured such that it functions as a constant current source and supply a first value of current during erase, and a second, lower value of current during monitoring. Alternatively, the current source 72 can be configured to limit the current to a first value during erase, and to a second, lower value during monitoring.

As an alternative to or in combination with variation of the current source, the resistance 74 can be controlled to provide a first value of resistance during erase, and a second, higher value of resistance during monitoring. In any case, the effect is to apply a smaller value of source current to the sources of the memory cells during monitoring than during erase, so that the source voltage is prevented from reaching and being clamped to the main supply voltage $V_{SS}$.

Figure 14A:
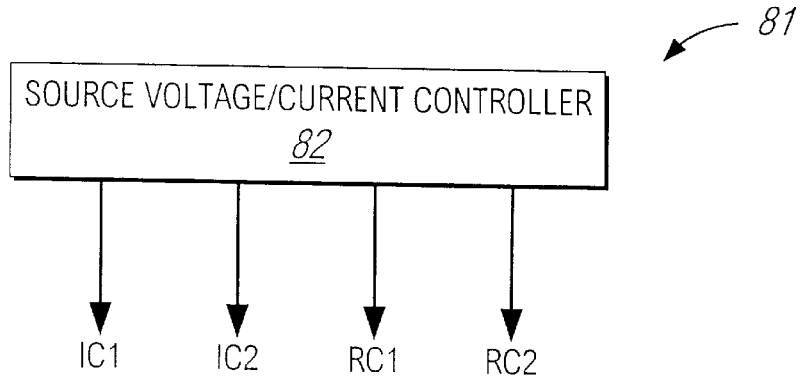
FIGS. 14a and 14b are electrical schematic diagrams illustrating a power supply having a discretely variable current source and resistance.
Figure 14B:
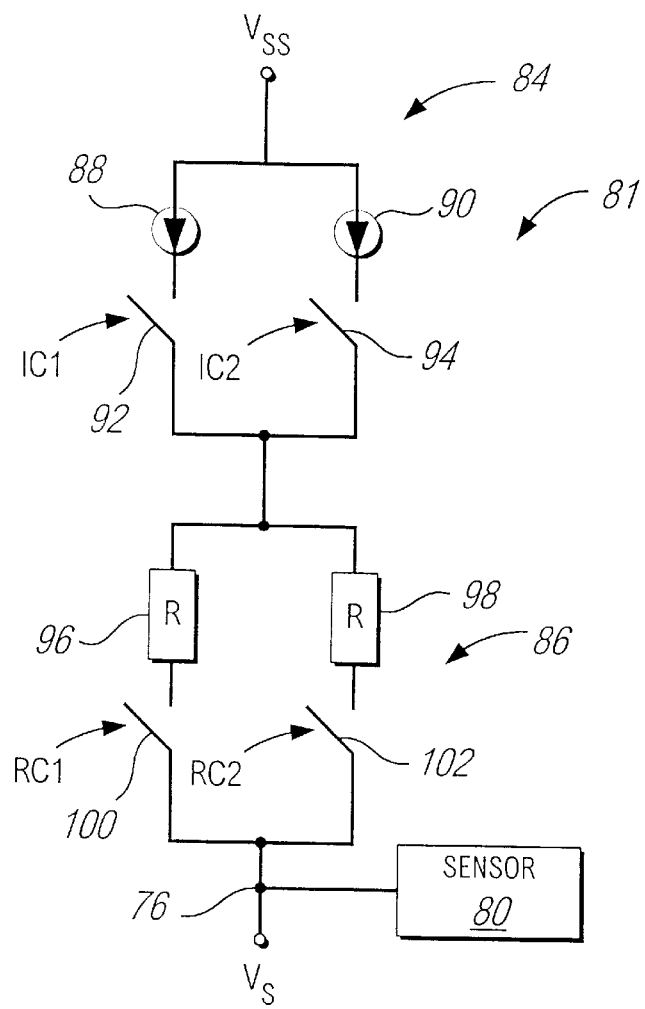

Whereas the arrangement illustrated in FIGS. 13a and 13b enables continuous variation of the current and resistance of the power supply 70, it is further within the scope of the invention to vary these values discretely, or in steps. FIG. 14a illustrates a source power supply 81 which includes a controller 82, which outputs four switching signals, IC1, IC2, RC1 and RC2. FIG. 14b illustrates a current source unit 84 and a resistance unit 86 which are connected in series between the supply $V_{SS}$ and the point 76 and are controlled by the switching signals.

The current source unit 84 includes two current sources 88 and 90 which supply a high current for erasure and a low current for monitoring respectively in the manner described above. The sources 88 and 90 are connected in series with switches 92 and 94 which are controlled by the signals IC1 and IC2 respectively. The resistance unit 86 includes two resistors 96 and 98 which have a low resistance for erasure and a high resistance for monitoring respectively. The resistors 96 and 98 are connected in series with switches 100 and 102 which are controlled by the signals RC1 and RC2 respectively.

For erasure, the controller 82 makes the signals IC1 and RC1 logically high to close the switches 92 and 100 and connect the current source 88 and resistor 96 in series between $V_{SS}$ and the point 76 so that a relatively high level of current is applied to the sources of the memory cells. During this procedure the signals IC2 and RC2 are low, so that the switches 94 and 102 are open and the circuit source 90 and resistor 98 are disconnected from the circuit. For monitoring, the switches 92 and 150 are opened and the switches 94 and 102 are closed to connect the source 90 and resistor 98 into the circuit.

The switches IC1,IC2,RC1,RC2 are used to obtain directly varying values of $I_C$ and $R_C$ during erase which are controlled by the output received from the sensor 80. The sensor 80 is a separate element.

As with the power supply 70 of FIGS. 13a and 13b, it is within the scope of the invention to vary only one of the current and resistance in the power supply 81. It is also possible to provide either the current source or the resistance as a fixed, rather than a variable element in either of these embodiments.

As described above, the source voltage is sensed or monitored to determine the state of erasure of the memory cells after application of each erase pulse. This information is then used to adjust the source power supply during the next erase pulse to provide an optimal vertical electric field across the tunnel oxide layers which corresponds to the state of erasure.

The present invention could possibly eliminate the time consuming procedure of erase verifying and correcting after application of each erase pulse as described in the above referenced patent to Cleveland, and effectively reduces the threshold voltage distribution since the electric field is optimized for each erase pulse and the reliability of the tunnel oxide layer is maximized.

As described above, the source voltage is sensed to provide an indication of the state of erasure. For each point on the source voltage curve 62 illustrated in FIG. 12, there are corresponding optimal values of vertical electric field and source voltage for the next erase pulse. The mapping between these values is determined empirically or using a computer simulation for each particular application.

The curve could also be modified for each unit by measuring at wafer sort (where each die is tested for functionality before packaging) so as to take into account manufacturing variations in the tunnel oxide thickness, coupling ratios, junction overlap, etc., which affect the electric field during erase.

Figure 15:
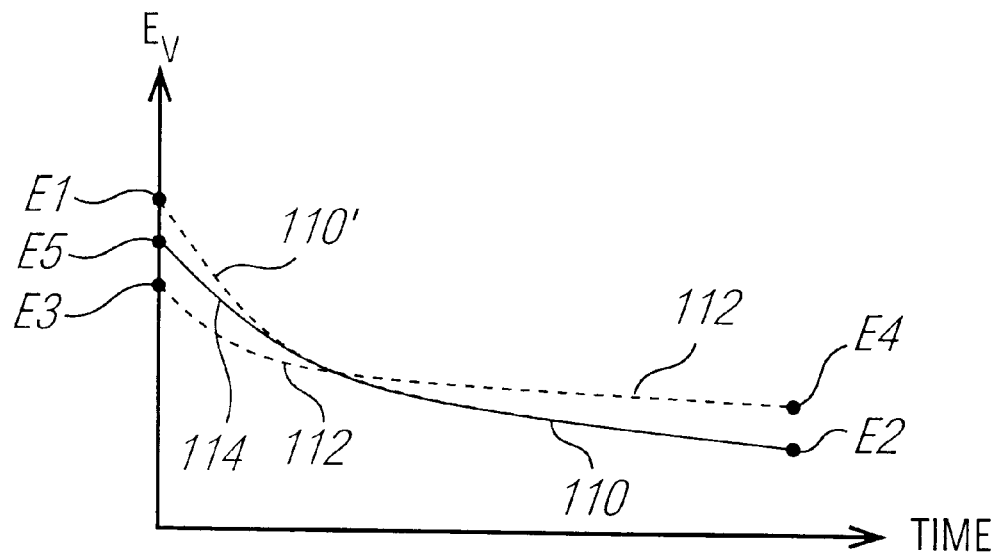
FIG. 15 is a graph illustrating the vertical electric field across the tunnel oxide layer of a memory cell as a function of time.

FIG. 15 illustrates how the vertical electric field $E_V$ across the tunnel oxide layer varies as a function of time, or equivalently with the number of applied erase pulses or percentage of completion of the erase operation. A solid line curve portion 110 and a broken line curve portion 110' illustrate the variation of vertical electric field for a purely resistive source power supply. It will be seen that the electrical field starts at a relatively high value E1 and decreases sharply to a final (EOE) value E2. The value E1 is generally too high, and results in a large threshold voltage distribution due to non-uniform erase and increased electric field stress which can cause degradation of tunnel oxide quality and reliability of the tunnel oxide layers at the beginning of the erase operation.

A broken line curve 112 illustrates the vertical electric field variation for a power supply including a pure current source. The initial electric field has a lower value E3 which provides excessively slow erasure, and decreases less sharply than in the resistive case to a final (EOE) value E4 which is too high and results in overerasure of fast and typical cells.

Using the method of the present invention, the source power supply is continuously adjusted as the erase operation progresses to provide an optimal vertical electric field having, for example, an initial value E5 which is intermediate between the values E1 and E3, and the same final (EOE) value E2 as for the pure resistance. The curve 114,110 can be directly mapped to the curve 62 as described above.

Figure 16:
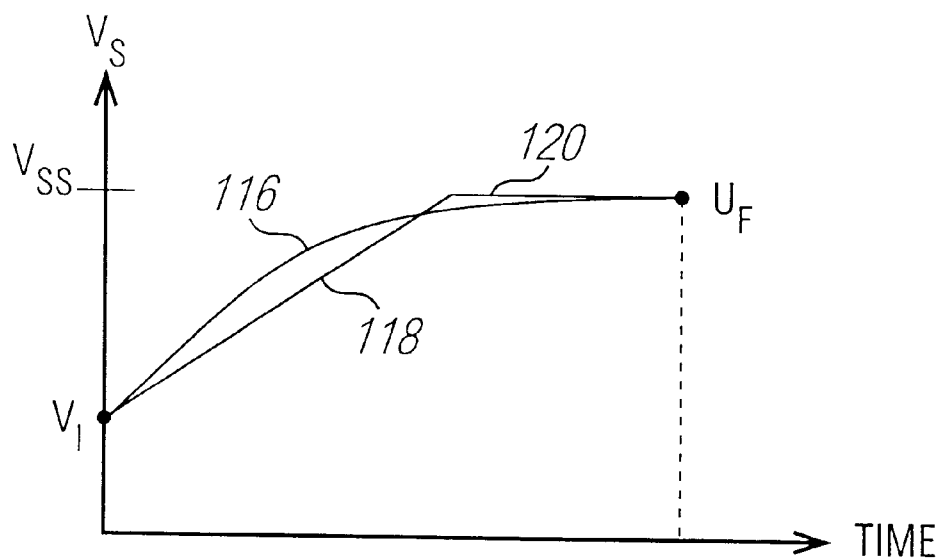
FIG. 16 is a graph illustrating how the source voltage is controlled during erase in accordance with the invention.

FIG. 16 illustrates an optimal source voltage curve 116 which can also be directly mapped to the curve 62. The controller 78 of the power supply 70 illustrated in FIGS. 13a and 13b is preferably used to optimally adjust the source voltage during erase by configuring the current source 72 and/or resistance 74 as a predetermined function of the sensed erase state (source voltage sensed by the sensor 80 during the last monitoring pulse).

For each point on the curve 62, the is a corresponding value of source current and resistance which produces the optimal source voltage and vertical electric field during erase. The controller 78 includes, although not explicitly illustrated, logic circuitry and/or a look-up table which provides the mapping between these parameters. In this manner, the controller 78 configures the power supply 70 to provide optimally and continuously adjusted values of source current and resistance throughout the erase operation. The controller can also be designed to take into account any changes in important parameters caused by manufacturing variations, which can be identified at wafer sort.

FIG. 16 further illustrates how the source voltage can be adjusted in discrete steps using the power supply 81 of FIGS. 14a and 14b, rather than continuously using the power supply 70. Although only two current sources and resistors are shown in FIG. 14b, it is within the scope of the invention to provide any number of current sources and resistors, for example four of each, to configure the power supply 81 for the erase and monitoring operations.

The optimal curve 116 has an initial value $V_I$ and a final value $V_F$ which is equal to $V_{SS}$. The curve 116 can be effectively approximated by two straight curve portions 118 and 120 to provide a substantial reduction in threshold voltage distribution over the prior art. It is also within the scope of the invention to approximate the ideal curve with any number of straight line segments.

Figure 17:
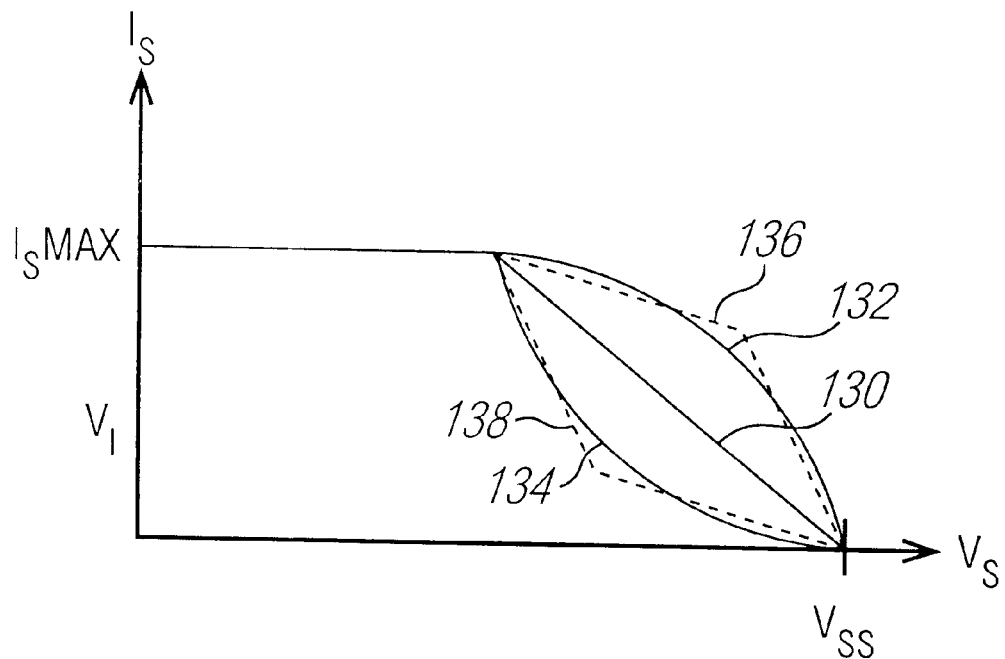
FIG. 17 is a graph illustrating how the resistance in a source power supply can be continuously adjusted.

FIG. 17 illustrates the effect of varying the resistance with the current maintained constant. The basic load line is indicated at 130. The resistance can be varied continuously as indicated by solid line curves 132 and 134, or in discrete steps as indicated by broken line curves 136 and 138, to adjust the load line to correspond to the desired source voltage and vertical electric field.

Figure 18:
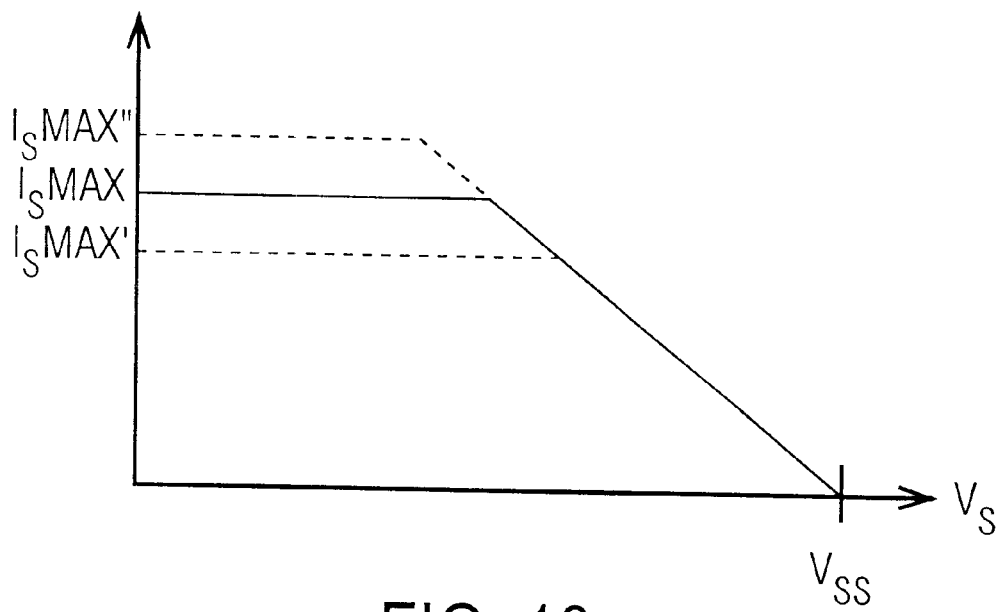
FIG. 18 is a graph illustrating how a current source limit can be continuously adjusted.

FIG. 18 illustrates the effect of varying the current source limit with the resistance maintained constant. The straight horizontal solid line portion of the curve corresponding to $I_S$MAX can be adjusted up or down as indicated in broken line to provide lower or higher current limit values $I_S$MAX' and $I_S$MAX" respectively. It is within the scope of the invention to vary the current source value, current source limit and/or resistance in any desired manner to produce an optimally configured source power supply.

Figure 19:
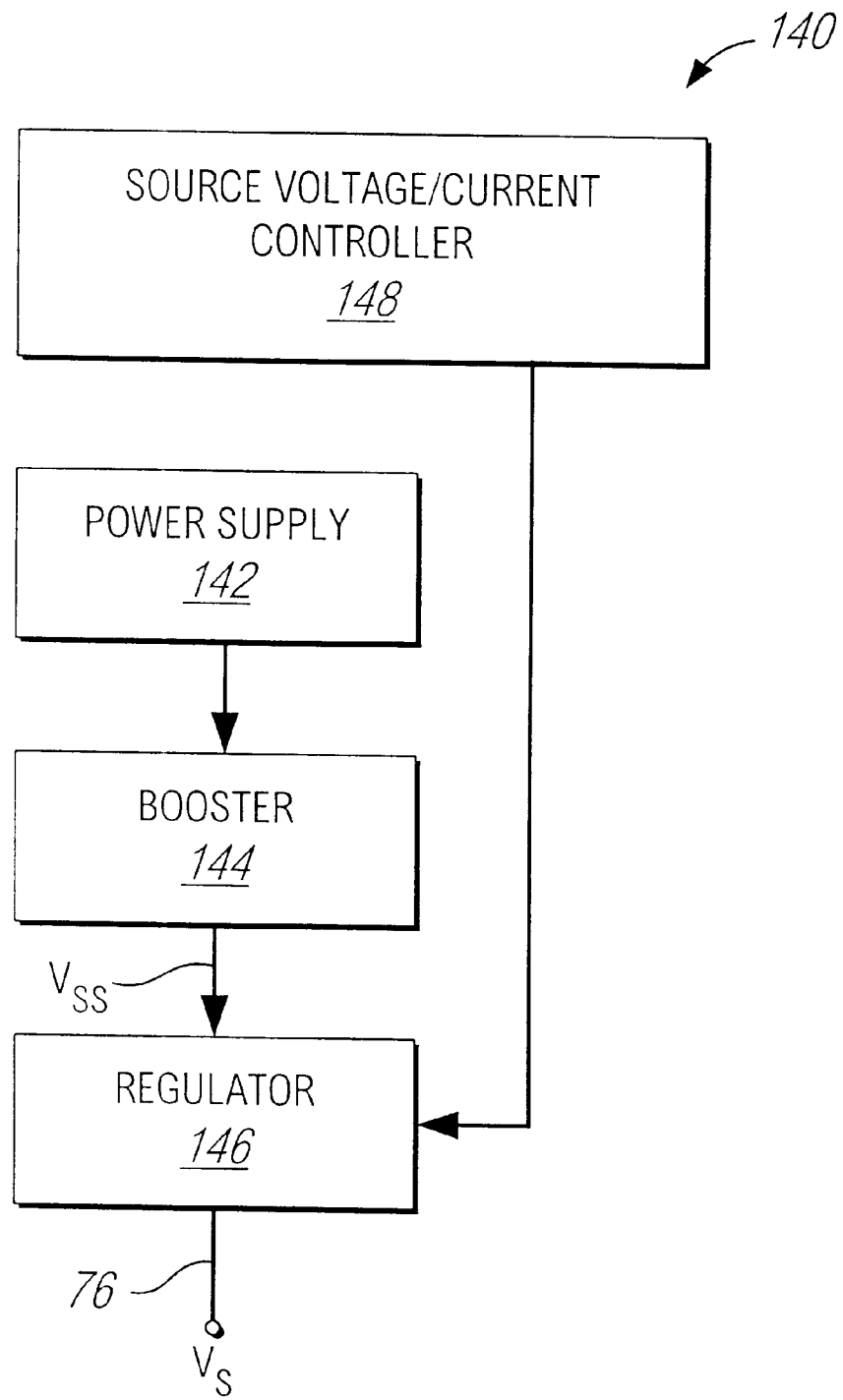
FIG. 19 is a diagram illustrating an alternative power supply according to the invention.

Whereas the embodiments of the invention described above use a resistive source power supply and vary current and/or resistance, it is further within the scope of the invention to provide a regulated voltage source and directly vary the source voltage. A power supply 140 illustrated in FIG. 19 includes an basic power source 142 which generates a voltage that is increased to provide the main source voltage $V_{SS}$ by a booster 144. The voltage $V_{SS}$ is adjusted by a voltage regulator 146 under control of a controller 148 such that the source voltage $V_S$ will have a desired value independent of band-to-band tunneling current.

Similar to the embodiments described above, there is a direct mapping between source voltage sensed during the last monitoring pulse and a corresponding optimal value of source voltage to be applied during the next erase pulse. This mapping is provided by the controller 148. The controller can be tuned at wafer sort to take into account manufacturing variations.

Configuration of the source power supply as a function of the erase state has been described heretofore as being performed in a closed loop arrangement based on feedback in the form of sensed source voltage. However, the invention is not so limited, and optimal control can also be performed in an open loop manner as applied to all of the embodiments described above.

Figure 12:
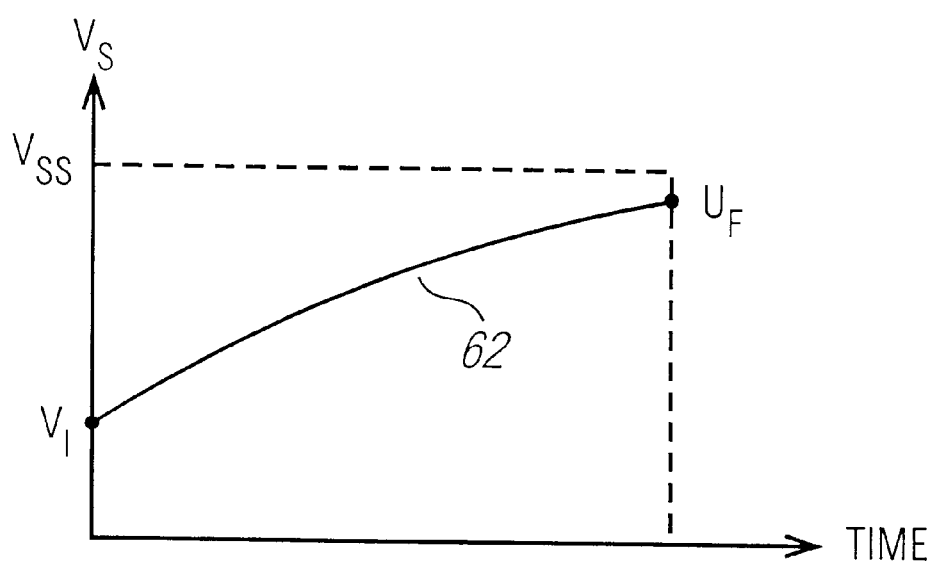
FIG. 12 is a graph illustrating how the source voltage increases as a function of time in accordance with the present invention.

Open loop control is performed by empirically testing or simulation to obtain the curve 62 of FIG. 12 and the mapping to the corresponding output variable which is the power source configuration (voltage, current and/or resistance). In this case, the erasure state as represented by elapsed time or number of applied pulses is used as the input variable.

The controller, although not explicitly illustrated, includes a timer or pulse counter which provides a value for the input variable, and a logic circuit, look-up table, etc. which provides a mapping between the input variable and the output variable(s). Thus, the power supply is configured by selecting the applied source voltage, current and/or resistance as a predetermined function of elapsed time or number of previously applied erase pulses.

In summary, the present invention overcomes the limitations of the prior art and fulfills the need for a method of accurately sensing the state of a flash EEPROM, and optimally adjusting the electric field across the tunnel oxide layers of the memory cells and thereby reducing the threshold voltage distribution.

Various modifications will become possible for those skilled in the art after receiving the teachings of the present disclosure without departing from the scope thereof.

I claim:

1. A method for erasing a flash Electrically-Erasable Programmable Read-Only Memory (EEPROM) which includes a plurality of field effect transistor memory cells each having a source, drain, floating gate and control gate, comprising the steps of:
    (a) connecting a power supply to the sources of the cells;
    (b) determining a state of erasure of the cells; and
    (c) applying an erase pulse to the cells with the power supply configured in accordance with a predetermined function of the state of erasure.

2. A method as in claim 1, in which:
    step (b) comprises sensing a source voltage of the cells; and
    step (c) comprises configuring the power supply as a predetermined function of the sensed source voltage.

3. A method as in claim 1, in which step (c) comprises configuring the power supply as a predetermined function of erase time.

4. A method as in claim 1, in which step (c) comprises configuring the power supply as a predetermined function of a number of erase pulses applied to the cells.

5. A method as in claim 1, in which:
    the power supply comprises a current source; and
    step (c) comprises configuring the current source to limit current flowing therefrom to the cells to a value according to said predetermined function of the state of erasure.

6. A method as in claim 5, in which:
    the current source comprises a continuously variable current limiting element; and
    step (c) comprises controlling the element in accordance with said predetermined function of the state of erasure.

7. A method as in claim 5, in which:
    the current source comprises a plurality of current limiting elements which limit current flowing therefrom to the cells to different values respectively; and
    step (c) comprises connecting one of the current limiting elements to the sources of the cells which is selected in accordance with said predetermined function of the state of erasure.

8. A method as in claim 1, in which:
    the power supply comprises a constant current source;
    step (c) comprises configuring the current source to supply a value of current to the cells according to said predetermined function of the state of erasure.

9. A method as in claim 8, in which:
    the constant current source comprises a continuously variable current sourcing element; and
    step (c) comprises controlling the element in accordance with said predetermined function of the state of erasure.

10. A method as in claim 8, in which:
    the current source comprises a plurality of current sourcing elements which supply different values of current to the cells respectively; and
    step (c) comprises connecting one of the current sourcing elements to the sources of the cells which is selected in accordance with said predetermined function of the state of erasure.

11. A method as in claim 1, in which:
    the power supply comprises a resistance;
    step (c) comprises configuring the resistance to have a value according to said predetermined function of the state of erasure.

12. A method as in claim 11, in which:
    the resistance comprises a continuously variable resistance element; and
    step (c) comprises controlling the element to provide a resistance in accordance with said predetermined function of the state of erasure.

13. A method as in claim 11, in which:
    the resistance comprises a plurality of resistance elements which provide different values of resistance respectively; and
    step (c) comprises connecting one of the elements to the sources of the cells which is selected in accordance with said predetermined function of the state of erasure.

14. A method as in claim 1, in which:
    the power supply comprises a voltage source; and
    step (c) comprises configuring the voltage source to apply a source voltage to the cells having a value according to said predetermined function of the state of erasure.

15. A method as in claim 14, in which the voltage source comprises a continuously variable voltage regulator; and step (c) comprises controlling the regulator to provide a resistance in accordance with said predetermined function of the state of erasure.

16. A flash Electrically-Erasable Programmable Read-Only Memory (EEPROM) which includes a plurality of field effect transistor memory cells each having a source, drain, floating gate and control gate, comprising:

a power supply; and a controller which cooperates with the power supply to perform the steps of:
(a) determining a state of erasure of the cells; and
(b) applying an erase pulse to the cells with the power supply configured in accordance with a predetermined function of the state of erasure.

17. A memory as in claim 16, further comprising a sensor for sensing a source voltage of the cells, in which:

step (a) comprises controlling the sensor to sense the source voltage; and step (b) comprises configuring the power supply as a predetermined function of the source voltage.

18. A memory as in claim 16, in which step (b) comprises configuring the power supply as a predetermined function of erase time.

19. A memory as in claim 16, in which step (b) comprises configuring the power supply as a predetermined function of a number of erase pulses applied to the cells.

20. A memory as in claim 16, in which:

the power supply comprises a current source; and step (b) comprises configuring the current source to limit current flowing therefrom to the cells to a value according to said predetermined function of the state of erasure.

21. A memory as in claim 20, in which:

the current source comprises a continuously variable current limiting element; and step (b) comprises controlling the element in accordance with said predetermined function of the state of erasure.

22. A memory as in claim 20, in which:

the current source comprises a plurality of current limiting elements which limit current flowing therefrom to the cells to different values respectively; and step (b) comprises connecting one of the current limiting elements to the sources of the cells which is selected in accordance with said predetermined function of the state of erasure.

23. A memory as in claim 16, in which:

the power supply comprises a constant current source;

step (b) comprises configuring the current source to supply a value of current to the cells according to said predetermined function of the state of erasure.

24. A memory as in claim 23, in which:

the constant current source comprises a continuously variable current sourcing element; and step (b) comprises controlling the element in accordance with said predetermined function of the state of erasure.

25. A memory as in claim 23, in which:

the current source comprises a plurality of current sourcing elements which supply different values of current to the cells respectively; and step (b) comprises connecting one of the current sourcing elements to the sources of the cells which is selected in accordance with said predetermined function of the state of erasure.

26. A memory as in claim 16, in which:

the power supply comprises a resistance;

step (b) comprises configuring the resistance to have a value according to said predetermined function of the state of erasure.

27. A memory as in claim 26, in which:

the resistance comprises a continuously variable resistance element; and step (b) comprises controlling the element to provide a resistance in accordance with said predetermined function of the state of erasure.

28. A memory as in claim 26, in which:

the resistance comprises a plurality of resistance elements which provide different values of resistance respectively; and step (b) comprises connecting one of the elements to the sources of the cells which is selected in accordance with said predetermined function of the state of erasure.

29. A memory as in claim 16, in which:

the power supply comprises a voltage source; and step (c) comprises configuring the voltage source to apply a source voltage to the cells having a value according to said predetermined function of the state of erasure.

30. A memory as in claim 29, in which the voltage source comprises a continuously variable voltage regulator; and step (c) comprises controlling the regulator to provide a resistance in accordance with said predetermined function of the state of erasure.

* * * * *